United States Patent
Nguyen et al.

(10) Patent No.: US 6,996,506 B2
(45) Date of Patent: *Feb. 7, 2006

(54) PROCESS AND DEVICE FOR DISPLACING A MOVEABLE UNIT ON A BASE

(75) Inventors: Van Diep Nguyen, Nemours (FR); Jean Levine, Paris (FR)

(73) Assignee: Newport Corporation, Irvine, CA (US)

( * ) Notice: Subject to any disclaimer, the term of this patent is extended or adjusted under 35 U.S.C. 154(b) by 980 days.

This patent is subject to a terminal disclaimer.

(21) Appl. No.: 09/805,598

(22) Filed: Mar. 12, 2001

(65) Prior Publication Data

US 2002/0079198 A1 Jun. 27, 2002
US 2005/0126892 A9 Jun. 27, 2002

Related U.S. Application Data (63) Continuation-in-part of application No. 09/362,643, filed on Jul. 27, 1999, now Pat. No. 6,438,461.

(30) Foreign Application Priority Data

Sep. 12, 2000 (FR) ............................. 00 11584

(51) Int. Cl.
*G06F 17/10* (2006.01)
*G06F 7/60* (2006.01)
*G06G 7/48* (2006.01)

(52) U.S. Cl. .................. 703/2; 703/1; 703/6; 703/7; 700/280; 700/302; 700/56; 700/60; 700/63

(58) Field of Classification Search ............. 703/1, 703/2, 6, 7; 700/280, 302, 56, 60, 63
See application file for complete search history.

(56) References Cited

U.S. PATENT DOCUMENTS 1,143,165 A 6/1915 Begusch
(Continued)

FOREIGN PATENT DOCUMENTS

CA 2199423 3/1996
(Continued)

OTHER PUBLICATIONS

J. M. Kahn, C. A. Burrus, and G. Raybon, High–Stability 1.5 um External–Cavity Semiconductor Lasers for Phase–Lock Applications, Photonics Technology Letters, vol. 1, No. 7, Jul. 1989.

(Continued)

*Primary Examiner*—Kevin J. Teska
*Assistant Examiner*—Ayal Sharon
(74) *Attorney, Agent, or Firm*—Ben J. Yorks, Esq.; Irell & Manella LLP (57) ABSTRACT

A Process and device for displacing a moveable unit on a base.

The process includes:

a) a force (F) is determined which, applied to the moveable unit (4), produces a combined effect, on the one hand, on the moveable unit (4) so that it exactly carries out the envisaged displacement on the base (2), especially as regards the prescribed duration and prescribed distance of the displacement, and, on the other hand, on the elements (MA1, MA2, MA3, 4) brought into motion by this displacement so that all these elements are immobile at the end of said displacement of the moveable unit (4);

and b) the force (F) thus determined is applied to the moveable unit (4).

31 Claims, 5 Drawing Sheets

U.S. PATENT DOCUMENTS

| | | |
|---|---|---|
| 1,306,906 A | 6/1919 | Jaques, Sr. |
| 2,367,139 A | 1/1945 | Ress |
| 3,357,268 A | 12/1967 | Richter |
| 3,442,475 A | 5/1969 | Rivin |
| 3,460,786 A | 8/1969 | Rivin |
| 3,478,608 A | 11/1969 | Met |
| 3,533,012 A | 10/1970 | Johnson et al. |
| 3,565,515 A | 2/1971 | De Mey, II |
| 3,577,791 A | 5/1971 | Vanden |
| 3,578,278 A | 5/1971 | Pickering |
| 3,601,476 A | 8/1971 | MacKenzie |
| 3,620,558 A | 11/1971 | MacMillan |
| 3,667,525 A | 6/1972 | Spieth |
| 3,751,025 A | 8/1973 | Beery et al. |
| 3,917,201 A | 11/1975 | Roll |
| 3,945,246 A | 3/1976 | Wadensten |
| 4,030,811 A | 6/1977 | Khoe et al. |
| 4,065,203 A | 12/1977 | Goell et al. |
| 4,079,404 A | 3/1978 | Comerford et al. |
| 4,088,396 A | 5/1978 | Edelstein |
| 4,119,363 A | 10/1978 | Camlibel et al. |
| 4,144,504 A | 3/1979 | Leggett et al. |
| 4,164,363 A | 8/1979 | Hsu |
| 4,167,744 A | 9/1979 | Nyul |
| 4,199,222 A | 4/1980 | Ikushima et al. |
| 4,237,474 A | 12/1980 | Ladany |
| 4,268,113 A | 5/1981 | Noel, Jr. |
| 4,295,152 A | 10/1981 | Khoe et al. |
| 4,296,998 A | 10/1981 | Dufft |
| 4,316,678 A | 2/1982 | F'Geppert |
| 4,332,469 A | 6/1982 | Wendland |
| 4,350,867 A | 9/1982 | Kinoshita et al. |
| 4,355,323 A | 10/1982 | Kock |
| 4,357,072 A | 11/1982 | Goodfellow et al. |
| 4,387,956 A | 6/1983 | Cline |
| 4,403,243 A | 9/1983 | Hakamada |
| 4,435,037 A | 3/1984 | Abramson et al. |
| 4,469,399 A | 9/1984 | Cowen et al. |
| 4,469,929 A | 9/1984 | Rosen et al. |
| 4,479,698 A | 10/1984 | Landis et al. |
| 4,500,165 A | 2/1985 | Scholl et al. |
| 4,506,108 A | 3/1985 | Kersch et al. |
| 4,523,802 A | 6/1985 | Sakaguchi et al. |
| 4,523,810 A | 6/1985 | Goss et al. |
| 4,550,410 A | 10/1985 | Chenausky et al. |
| 4,615,031 A | 9/1986 | Eales et al. |
| 4,623,220 A | 11/1986 | Grabbe et al. |
| 4,647,147 A | 3/1987 | Pikulski et al. |
| 4,647,331 A | 3/1987 | Koury, Jr. et al. |
| 4,657,429 A | 4/1987 | Morris |
| 4,664,732 A | 5/1987 | Campbell et al. |
| 4,673,244 A | 6/1987 | Miles |
| 4,673,245 A | 6/1987 | Kling et al. |
| 4,677,290 A | 6/1987 | Mitch |
| 4,678,271 A | 7/1987 | Beaulieu |
| 4,679,908 A | 7/1987 | Goodwin |
| 4,701,013 A | 10/1987 | Jurczyszyn et al. |
| 4,702,556 A | 10/1987 | Ishii et al. |
| 4,708,429 A | 11/1987 | Clark et al. |
| 4,714,315 A | 12/1987 | Krause |
| 4,720,163 A | 1/1988 | Goodwin et al. |
| 4,746,195 A | 5/1988 | Auracher et al. |
| 4,747,657 A | 5/1988 | Chaoui et al. |
| 4,748,632 A | 5/1988 | Preston |
| 4,759,600 A | 7/1988 | Caron et al. |
| 4,763,979 A | 8/1988 | Heywang |
| 4,767,174 A | 8/1988 | Carenco et al. |
| 4,773,730 A | 9/1988 | Sedlmayr |
| 4,779,946 A | 10/1988 | Pimpinella et al. |
| 4,779,959 A | 10/1988 | Saunders |
| 4,782,223 A | 11/1988 | Suzuki |
| 4,787,691 A | 11/1988 | Lorenzo et al. |
| 4,800,262 A | 1/1989 | Lentine |
| 4,807,750 A | 2/1989 | Ryder et al. |
| 4,823,220 A | 4/1989 | Milster et al. |
| 4,837,768 A | 6/1989 | Schmid |
| 4,842,397 A | 6/1989 | Eisler |
| 4,850,261 A | 7/1989 | Greene |
| 4,850,671 A | 7/1989 | Finzel |
| 4,854,667 A | 8/1989 | Ebata et al. |
| 4,913,527 A | 4/1990 | Jessop |
| 4,914,867 A | 4/1990 | Saito et al. |
| 4,915,482 A | 4/1990 | Collins et al. |
| 4,938,564 A | 7/1990 | Romero |
| 4,966,474 A | 10/1990 | Geiger |
| 4,978,910 A | 12/1990 | Knox et al. |
| 4,988,159 A | 1/1991 | Turner et al. |
| 4,988,165 A | 1/1991 | Ishii et al. |
| 5,000,415 A | 3/1991 | Sandercock |
| 5,044,719 A | 9/1991 | Nakamura |
| 5,058,124 A | 10/1991 | Cameron et al. |
| 5,068,749 A | 11/1991 | Patel |
| 5,077,747 A | 12/1991 | Hemmer et al. |
| 5,132,824 A | 7/1992 | Patel et al. |
| 5,138,496 A | 8/1992 | Pong |
| 5,140,470 A | 8/1992 | Luecke |
| 5,146,532 A | 9/1992 | Hodge |
| 5,150,236 A | 9/1992 | Patel |
| 5,179,618 A | 1/1993 | Anton |
| 5,183,350 A | 2/1993 | Kramer |
| 5,189,725 A | 2/1993 | Bensel, III et al. |
| 5,191,587 A | 3/1993 | Hanson et al. |
| 5,194,993 A | 3/1993 | Bedzyk |
| 5,214,735 A | 5/1993 | Henneberger et al. |
| 5,218,258 A | 6/1993 | Shirasu et al. |
| 5,218,610 A | 6/1993 | Dixon |
| 5,219,051 A | 6/1993 | Davis |
| 5,245,552 A | 9/1993 | Andersson et al. |
| 5,251,863 A | 10/1993 | Gossman et al. |
| 5,285,995 A | 2/1994 | Gonzalez et al. |
| 5,289,559 A | 2/1994 | Wilson |
| 5,300,755 A | 4/1994 | Nishitani et al. |
| 5,311,278 A | 5/1994 | Rosencher |
| 5,319,435 A | 6/1994 | Melle et al. |
| 5,321,539 A | 6/1994 | Hirabayashi et al. |
| 5,327,061 A | 7/1994 | Gullapalli |
| 5,337,383 A | 8/1994 | DeAngelis et al. |
| 5,367,140 A | 11/1994 | Jouaneh et al. |
| 5,410,145 A | 4/1995 | Coroy |
| 5,428,225 A | 6/1995 | Silva et al. |
| 5,428,635 A | 6/1995 | Zhiglinsky et al. |
| 5,434,944 A | 7/1995 | Kerry et al. |
| 5,434,945 A | 7/1995 | Burek et al. |
| 5,463,647 A | 10/1995 | Pan |
| 5,469,265 A | 11/1995 | Measures et al. |
| 5,499,261 A | 3/1996 | Welch et al. |
| 5,502,598 A | 3/1996 | Kimura et al. |
| 5,528,718 A | 6/1996 | Ray et al. |
| 5,530,547 A | 6/1996 | Arnold |
| 5,530,785 A | 6/1996 | Sakamoto et al. |
| 5,553,186 A | 9/1996 | Allen |
| 5,563,972 A | 10/1996 | Krausse et al. |
| 5,564,537 A | 10/1996 | Shoureshi |
| 5,570,444 A | 10/1996 | Janssen et al. |
| 5,581,077 A | 12/1996 | Chirovsky et al. |
| 5,598,500 A | 1/1997 | Crespel et al. |
| 5,603,387 A | 2/1997 | Beard et al. |
| 5,617,501 A | 4/1997 | Miller et al. |
| 5,619,609 A | 4/1997 | Pan et al. |
| 5,638,482 A | 6/1997 | Winterhoff et al. |
| 5,653,317 A | 8/1997 | Wakui |

| | | |
|---|---|---|
| 5,655,045 A | 8/1997 | Morlion et al. |
| 5,660,255 A | 8/1997 | Schubert et al. |
| 5,668,906 A | 9/1997 | Yamamura et al. |
| 5,673,350 A | 9/1997 | Song et al. |
| 5,689,607 A | 11/1997 | Vincent et al. |
| 5,717,804 A | 2/1998 | Pan et al. |
| 5,725,066 A | 3/1998 | Beard et al. |
| 5,737,132 A | 4/1998 | Luecke et al. |
| 5,745,633 A | 4/1998 | Giebel et al. |
| 5,748,821 A | 5/1998 | Schempp et al. |
| 5,751,877 A | 5/1998 | Ishizaka et al. |
| 5,757,155 A * | 5/1998 | Autran et al. ............... 318/443 |
| 5,757,561 A | 5/1998 | Sechrist et al. |
| 5,758,004 A | 5/1998 | Alarcon et al. |
| 5,761,360 A | 6/1998 | Grois et al. |
| 5,765,800 A | 6/1998 | Watanabe et al. |
| 5,774,614 A | 6/1998 | Gilliland et al. |
| 5,793,920 A | 8/1998 | Wilkins et al. |
| 5,793,921 A | 8/1998 | Wilkins et al. |
| 5,794,912 A | 8/1998 | Whittaker et al. |
| 5,823,307 A | 10/1998 | Schubert et al. |
| 5,825,558 A | 10/1998 | Farmiga et al. |
| 5,852,519 A | 12/1998 | Do et al. |
| 5,880,894 A | 3/1999 | Blakley |
| 5,909,324 A | 6/1999 | Bryant et al. |
| 5,930,057 A | 7/1999 | Sechrist et al. |
| 5,941,920 A | 8/1999 | Schubert |
| 5,946,023 A | 8/1999 | Blanding |
| 5,963,695 A | 10/1999 | Joyce |
| 6,016,230 A | 1/2000 | Nunnally et al. |
| 6,022,005 A | 2/2000 | Gran et al. |
| 6,198,580 B1 | 3/2001 | Dallakian |
| 6,209,841 B1 | 4/2001 | Houghton, Jr. et al. |
| 6,438,461 B1 * | 8/2002 | Desailly et al. ............. 700/280 |

FOREIGN PATENT DOCUMENTS

| | | |
|---|---|---|
| EP | 1031883 A1 * | 8/2000 |
| GB | 2 124 402 A | 7/1982 |
| GB | 2 131 971 A | 6/1984 |
| JP | 200250631 A * | 9/2000 |

OTHER PUBLICATIONS

P. Zorabedian and W. R. Trutna, Jr., "Interference–filter-tuned, alignment–stabilized, semiconductor external–cavity laser", 1988, Optical Society of America.

A. Schremer and C. L. Tang, "Single–Frequency tunable external–cavity semiconductor laser using an electro–optic birefringent modulator", Appl. Phys. Lett., vol. 55, No. 1, Jul. 3, 1989.

M. W. Maeda, J. S. Patel, D. A. Smith, Chinlon Lin, M. A. Saifi, and A. Von Lehman, "An Electronically Tunable Fiber Laser with a Liquid–Crystal Etalon Filter as the Wavelength–Tuning Element", IEEE Photonics Technology Letters, vol. 2, No. 11, Nov. 1990.

Katsuhiko Hirabayashi, Hiroyuki Tsuda, and Takashi Kurokawa, "Tunable Liquid–Crystal Fabry–Perol Interferometer Filter for Wavelength–Division Multiplexing Communication Systems", Journal of Lightwave Technology, vol. 11, No. 12, Dec. 1993.

Stephen R. Mallinson, "Wavelength–selective filters for single–mode fiber WDM systems using Fabry–Perot interferometers", Applied Optics, vol. 26, No. 3, Feb. 1, 1987.

W. Gunning, J. Pasko, J. Tracy, "A liquid crystal tunable spectral filter: visible and infrared operation", SPIE vol. 268 Imaging Spectroscopy (1981).

Hiroyuki Tsuda, Katsuhiko Hirabayashi, Yuichi Tohmori, and Takashi Kurokawa, "Tunable Light Source Using a Liquid–Crystal Fabry–Perot Interferometer", IEEE Photonics Technology Letters, vol. 3. No. 6, Jun. 1991.

John R. Andrews, "Low Voltage Wavelength Tuning of an External Cavity Diode Laser Using a Nematic Liquid Crystal–Containing Birefringent Filert", IEEE Photonics Technology Letters. vol. 2, No. 5, May 1990.

N. A. Olsson and J. P. Van Der Ziel, "Performance Characteristics of 1.5–um External Cavity Semiconductor Lasers for Coherent Optical Communication", Journal Of Lightwave Technology, vol. LT–5. No. 4, Apr. 1987.

Hecht Optics Second Edition, Eugene Hecht, reprinted 1990, reference text, pp. 303 # 368.

Rivin, Eugene I., "Vibration Isolation of precision equipment", Precision Engineering, 1995, pp. 41–56, vol. 17.

"Marsh Mellow Springs Vibration Isolation Design Manual", 1998, Firestone Industrial Products Company.

Rivin, Eugene I., "Shaped Elastomeric Components for Vibration Control Devices", Sound and Vibration, Jul. 1999, pp. 18–23, vol. 33, No. 7.

* cited by examiner

PROCESS AND DEVICE FOR DISPLACING A MOVEABLE UNIT ON A BASE

REFERENCE TO CROSS-RELATED APPLICATIONS

This application is a continuation-in-part of U.S. application Ser. No. 09/362,643 filed Jul. 27, 1999, U.S. Pat. No. 6,438,461.

BACKGROUND OF THE INVENTION

Field of the Invention

The present invention relates to a process and a device for displacing a moveable unit on a base.

Said device is of the type comprising a controllable actuator, for example an electric motor, intended to give rise to a linear displacement of the moveable unit on the base, as well as a system which is formed of a plurality of elements which are brought into motion upon the displacement of said moveable unit.

Within the context of the present invention, said system exhibits at least two different motions and comprises as elements which may be brought into motion, in particular:

said base which can be mounted elastically with respect to the floor, especially so as to isolate it from vibrations originating from said floor; and/or one or more auxiliary masses, for example measurement supports and/or loads, which are tied elastically to the base; and/or one or more auxiliary masses, for example likewise measurement supports and/or loads, which are tied elastically to the moveable unit.

When the moveable unit is set into motion, said elements of the system begin to move. However, especially by reason of the aforesaid elastic link, these elements still continue to move when the displacement of the moveable unit has terminated and when the latter comes to a stop.

Such a continuance of the motions of said system is generally undesirable, since it may entail numerous drawbacks. In particular, it may disturb measurements, especially positioning measurements, which are made on the moveable unit or on these elements.

Also, an object of the present invention is to control the moveable unit in such a way that all the moving elements of said system, for example the base and/or auxiliary masses, are stationary at the end of the displacement of the moveable unit.

As regards said base, if it is mounted elastically with respect to the floor, it is known that, when the moveable unit is set into motion, during the acceleration and deceleration phases, it is subjected to the reaction of the force applied to the moveable unit by the actuator. This reaction load excites the base which then oscillates on its supports. This disturbs the relative positioning of the moveable unit with respect to the base, and greatly impedes the accuracy of the device.

This relative position error persists after the end of the displacement of the moveable unit and disappears only after the stabilization (which takes place much later) of the base.

Various solutions for remedying this drawback are known. Some of these solutions make provision in particular:

to immobilize the base during the acceleration and deceleration phases via a disabling system, for example an electromagnetic disabling system, which is mounted in parallel with the elastic supports. However, this known solution prevents the supports from isolating the base from the vibrations originating from the floor during said acceleration and deceleration phases;

to cancel the effect produced by the force developed by the actuator, by making provision for an additional actuator which is arranged between the base and the floor and which develops an additional force of the same amplitude but oppositely directed; or to displace an additional moveable unit on the base according to a similar displacement, but oppositely directed, with respect to the displacement of the moveable unit, so as to cancel the inertia effects.

However, none of these known solutions is satisfactory, since their effectivenesses are restricted and since they all require supplementary means (disabling system, additional actuator, additional moveable unit) which increase in particular the complexity, the cost and the bulkiness of the device.

Moreover, above all, these solutions implement an action which acts only on the base and not on the other elements of the system which, for their part, continue to move when the moveable unit is stationary.

The object of the present invention is to remedy these drawbacks. It relates to a process for displacing, in an extremely accurate manner and at restricted cost, a moveable unit on a base mounted for example on the floor, whilst bringing all the motions to which this displacement gives rise to a stop at the end of the displacement, said moveable unit being displaced linearly according to a displacement which is predetermined in terms of distance and time, under the action of a controllable force.

Accordingly, said process is noteworthy according to the invention in that:

a) equations are defined which:
   illustrate a dynamic model of a system formed by elements, of which said moveable unit is one, which are brought into motion upon a displacement of said moveable unit; and
   comprise at least two variables, of which the position of said moveable unit is one;

b) all the variables of this system, together with said force, are expressed as a function of one and the same intermediate variable y and of a specified number of derivatives as a function of time of this intermediate variable, said force being such that, applied to said moveable unit, it displaces the latter according to said specified displacement and renders all the elements of said system immobile at the end of said displacement;

c) the initial and final conditions of all said variables are determined;

d) the value as a function of time of said intermediate variable is determined from the expressions for the variables defined in step b) and said initial and final conditions;

e) the value as a function of time of said force is calculated from the expression for the force, defined in step b) and said value of the intermediate variable, determined in step d); and f) the value thus calculated of said force is applied to said moveable unit.

Thus, the force applied to the moveable unit enables the latter to carry out the predetermined displacement envisaged, especially in terms of time and distance, whilst rendering the elements brought into motion by this displacement immobile at the end of the displacement so that they do not oscillate and, in particular, do not disturb the relative positioning between themselves and the moveable unit.

It will be noted moreover that, by reason of this combined control of said moveable unit and of said moving elements, one obtains an extremely accurate displacement of the moveable unit in a reference frame independent of the base and tied for example to the floor.

It will be noted that the implementation of the process in accordance with the invention is not limited to a displacement along a single axis, but can also be applied to displacements along several axes which can be regarded as independent.

Advantageously, in step a), the following operations are carried out: the variables of the system are denoted xi, i going from 1 to p, p being an integer greater than or equal to 2, and the balance of the forces and of the moments is expressed, approximating to first order if necessary, in the so-called polynomial matrix form:

$$A(s)X = bF$$

with:

$A(s)$ matrix of size p×p whose elements $Aij(s)$ are polynomials of the variable $s=d/dt$;

X the vector $$\begin{pmatrix} x1 \\ \vdots \\ xp \end{pmatrix};$$

b the vector of dimension p; and

F the force exerted by the motor.

Advantageously, in step b), the following operations are carried out:

the different variables xi of said system, i going from 1 to p, each being required to satisfy a first expression of the form:

$$xi = \sum_{j=0}^{j=r} pi, j \cdot y^{(j)},$$

the $y^{(j)}$ being the derivatives of order j of the intermediate variable y, r being a predetermined integer and the pi, j being parameters to be determined, a second expression is obtained by putting $y^{(j)} = s^j \cdot y$:

$$xi = \left( \sum_{j=0}^{j=r} pi, j \cdot s^j \right) y = Pi(s) \cdot y,$$

a third expression of vectorial type is defined on the basis of the second expressions relating to the different variables xi of the system:

$$X = P \cdot Y$$

comprising the vector $$P = \begin{pmatrix} P1 \\ \vdots \\ Pp \end{pmatrix}$$

said vector P is calculated, by replacing X by the value $P \cdot y$ in the following system:

$$\begin{cases} B^T \cdot A(s) \cdot P(s) = Op - 1 \\ bp \cdot F = \sum_{j=i}^{j=p} Ap, j(s) \cdot Pj(s) \cdot y \end{cases}$$

in which:

$B^T$ is the transpose of a matrix B of size p×(p−1), such that $B^T b = Op - 1$;

bp is the p-th component of the vector b previously defined; and

Op−1 is a zero vector of dimension (p−1);

the values of the different parameters pi,j are deduced from the value thus calculated of the vector P; and from these latter values are deduced the values of the variables xi as a function of the intermediate variable y and of its derivatives, on each occasion using the corresponding first expression.

Thus, a fast and general method of calculation is obtained for calculating the relations between the variables of the system and said intermediate variable, in the form of linear combinations of the latter and of its derivatives with respect to time.

Advantageously, in step d), a polynomial expression for the intermediate variable y is used to determine the value of the latter.

In this case, preferably, the initial and final conditions of the different variables of the system, together with the expressions defined in step b), are used to determine the parameters of this polynomial expression.

In a first embodiment, for displacing a moveable unit on a base which is mounted elastically with respect to the floor and which may be subjected to linear and angular motions, advantageously, the variables of the system are the linear position x of the moveable unit, the linear position xB of the base and the angular position θz of the base, which satisfy the relations:

$$\begin{cases} x = y + \left( \frac{rB}{kB} + \frac{r\theta}{k\theta} \right) y^{(1)} + \left( \frac{mB}{kB} + \frac{rBr\theta}{kBk\theta} + \frac{J}{k\theta} \right) y^{(2)} + \\ \qquad \left( \frac{rBJ}{kBk\theta} + \frac{mBr\theta}{kBk\theta} \right) y^{(3)} + \frac{mBJ}{kBk\theta} y^{(4)} \\ xB = -\frac{m}{kB} \left( \frac{J}{k\theta} y^{(4)} + \frac{r\theta}{k\theta} y^{(3)} + y^{(2)} \right) \\ \theta z = -d \frac{m}{k\theta} \left( \frac{mB}{kB} y^{(4)} + \frac{rB}{kB} y^{(3)} + y^{(2)} \right) \end{cases}$$

n which:

m is the mass of the moveable unit;

mB, kB, kθ, rB, rθ are respectively the mass, the linear stiffness, the torsional stiffness, the linear damping and the torsional damping of the base;

J is the inertia of the base with respect to a vertical axis;

d is the distance between the axis of translation of the center of mass of the moveable unit and that of the base; and $y^{(1)}$, $y^{(2)}$, $y^{(3)}$ and $y^{(4)}$ are respectively the first to fourth derivatives of the variable y.

This first embodiment makes it possible to remedy the aforesaid drawbacks (inaccurate displacement, etc) related to the setting of the base into oscillation during the displacement of the moveable unit.

In a second embodiment, for displacing on a base a moveable unit on which are elastically mounted a number p of auxiliary masses MAi, p being greater than or equal to 1, i going from 1 to p, advantageously, the variables of the system are the position x of the moveable unit and the (linear) positions zi of the p auxiliary masses MAi, which satisfy the relations:

$$\begin{cases} x = \left( \prod_{i=1}^{p} \left( \frac{mi}{ki}s^2 + \frac{ri}{ki}s + 1 \right) \right) \cdot y \\ zi = \left( \prod_{\substack{j=1 \\ j \ne i}}^{p} \left( \frac{mj}{kj}s^2 + \frac{rj}{kj}s + 1 \right) \right) \cdot \left( \frac{ri}{ki}s + 1 \right) \cdot y \end{cases}$$

in which:

Π illustrates the product of the associated expressions;

mi, zi, ki and ri are respectively the mass, the position, the stiffness and the damping of an auxiliary mass MAi;

mj, kj and rj are respectively the mass, the stiffness and the damping of an auxiliary mass MAj; and s=d/dt.

In a third embodiment, for displacing a moveable unit on a base which is mounted elastically with respect to the floor and on which is elastically mounted an auxiliary mass, advantageously, the variables of the system are the positions x, xB and zA respectively of the moveable unit, of the base and of the auxiliary mass, which satisfy the relations:

$$\begin{cases} x = [(mAs^2 + rAs + kA) \cdot (mBs^2 + (rA + rB)s + (kA + kB)) - \\ \quad (rAs + kA)^2] \cdot y \\ xB = -M y^{(2)} \\ zA = -M(rAy^{(3)} + kAy^{(2)}) \end{cases}$$

in which:

M, mB and mA are the masses respectively of the moveable unit, of the base and of the auxiliary mass;

rA and rB are the dampings respectively of the auxiliary mass and of the base;

kA and kB are the stiffnesses respectively of the auxiliary mass and of the base; and s=d/dt.

In a fourth embodiment, for displacing on a base mounted elastically with respect to the floor, a moveable unit on which is elastically mounted an auxiliary mass, advantageously, the variables of the system are the positions x, xB and zC respectively of the moveable unit, of the base and of the auxiliary mass, which satisfy the relations:

$$\begin{cases} x = [(mCs^2 + rCs + kC) \cdot (mBs^2 + rBs + kB)] \cdot y \\ xB = [(mCs^2 + rCs + kC) \cdot (Ms^2 + rCs + kC) - (rCs + kC)^2] \cdot y \\ zC = (rCs + kC) \cdot (mBs^2 + rBs + kB) \cdot y \end{cases}$$

in which:

M, mB and mC are the masses respectively of the moveable unit, of the base and of the auxiliary mass;

rB and rC are the dampings respectively of the base and of the auxiliary mass;

kB and kC are the stiffnesses respectively of the base and of the auxiliary mass; and s=d/dt.

The present invention also relates to a device of the type comprising:

a base mounted directly or indirectly on the floor;

a moveable unit which may be displaced linearly on said base; and a controllable actuator able to apply a force to said moveable unit with a view to its displacement on said base.

According to the invention, said device is noteworthy in that it furthermore comprises means, for example a calculator: which implement steps a) to e) of the aforesaid process, so as to calculate a force which, applied to said moveable unit, makes it possible to obtain the combined effect or control indicated above; and which determine a control command and transmit it to said actuator so that it applies the force thus calculated to said moveable unit, during a displacement.

Thus, over and above the aforesaid advantages, the device in accordance with the invention does not require any additional mechanical means, thereby reducing its cost and its bulkiness and simplifying its embodiment, with respect to the known and aforesaid devices.

The figures of the appended drawing will elucidate the manner in which the invention may be embodied. In these figures, identical references designate similar elements.

Figure 1:
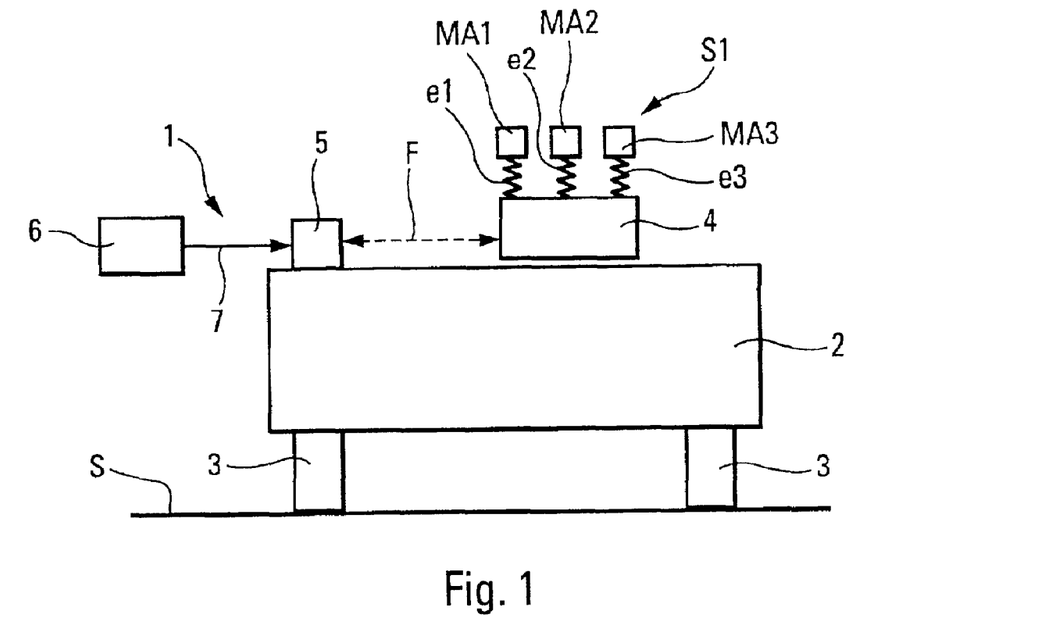
FIGS. 1 and 2 respectively illustrate two different embodiments of the device in accordance with the invention.
Figure 2:
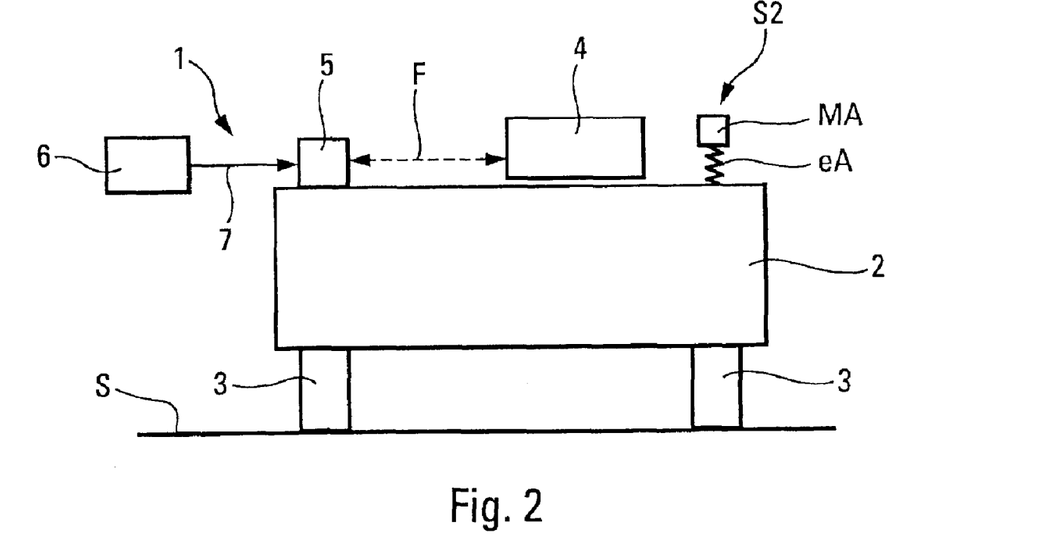
Figure 3:
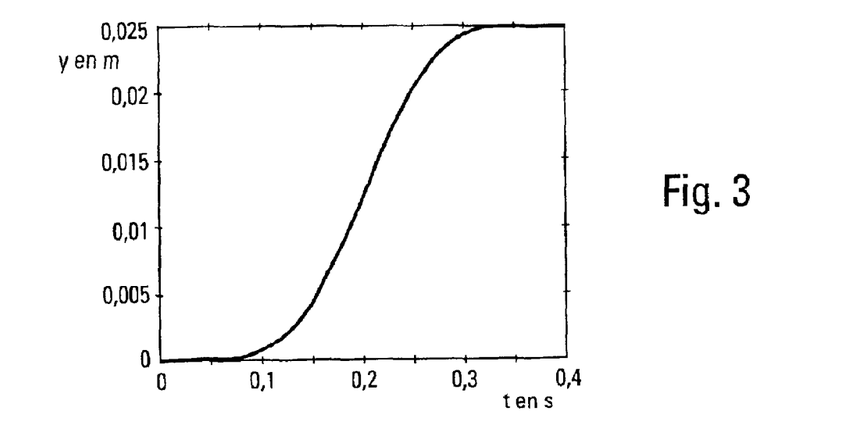
FIGS. 3 to 7 represent graphs which illustrate the variations over time of variables of the system, for a first embodiment of the device in accordance with the invention.
Figure 4:
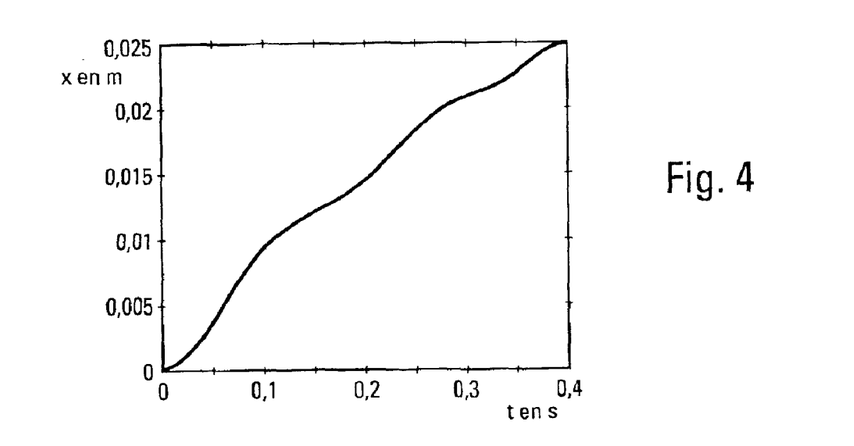
Figure 5:
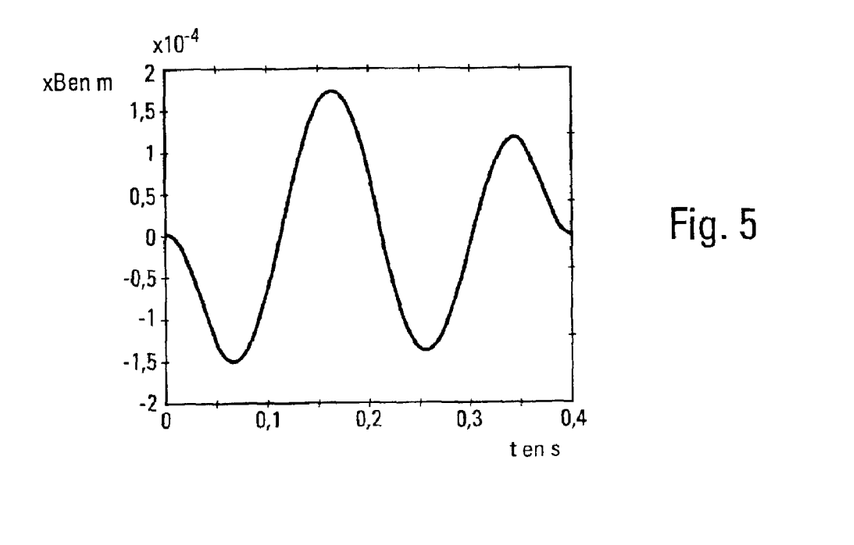
Figure 6:
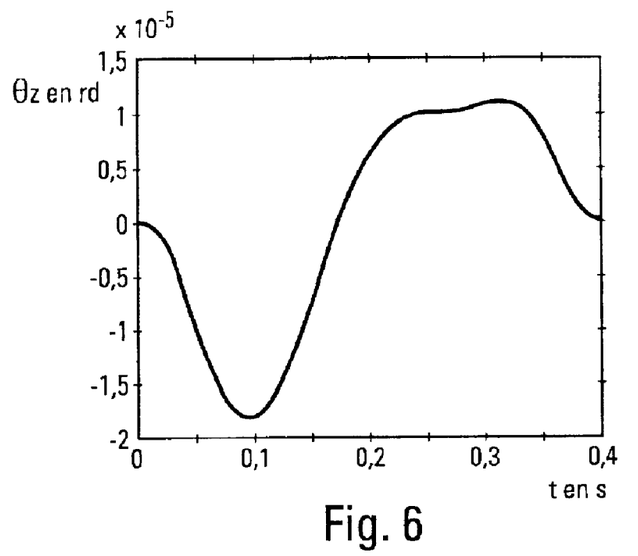
Figure 7:
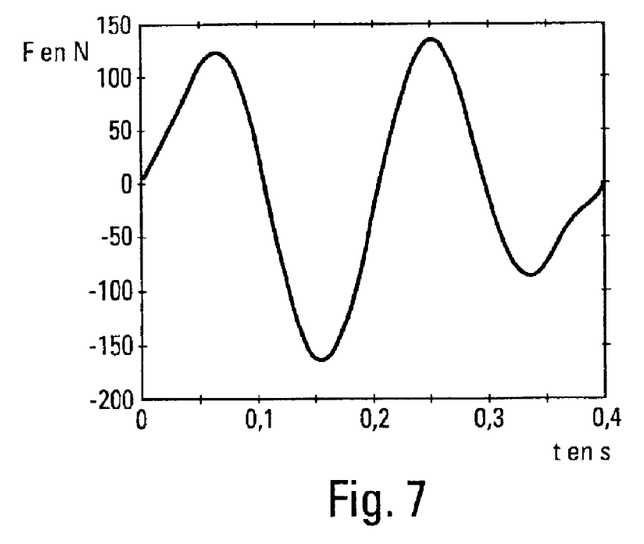
Figure 8:
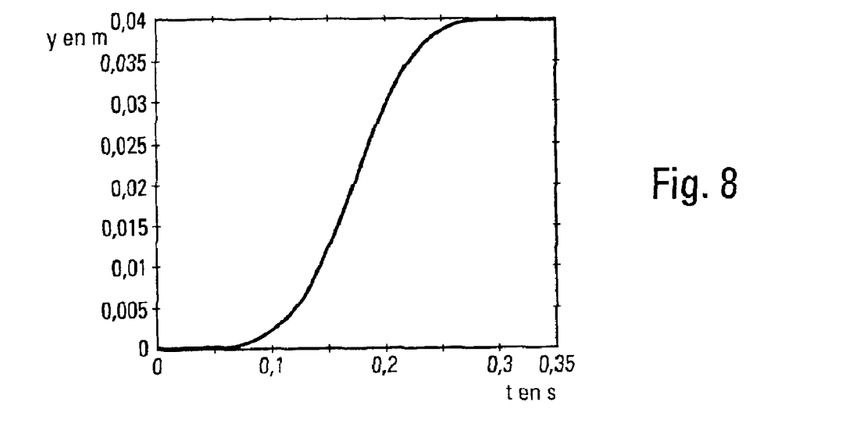
FIGS. 8 to 13 represent graphs which illustrate the variations over time of variables of the system, for a second embodiment of the device in accordance with the invention.
Figure 9:
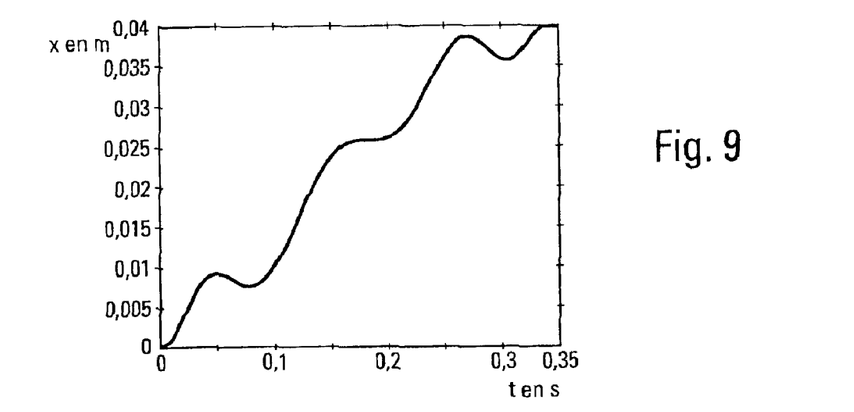
Figure 10:
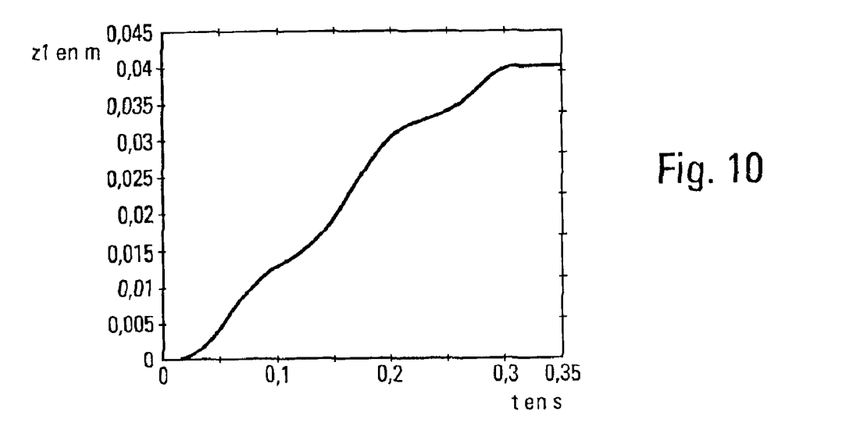
Figure 11:
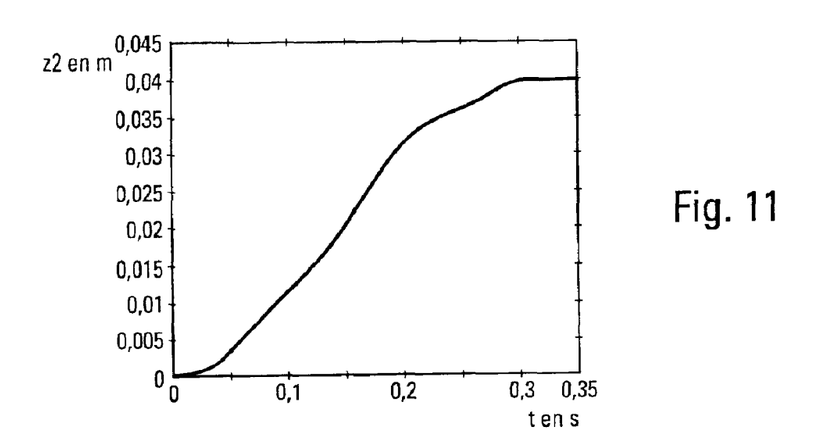
Figure 12:
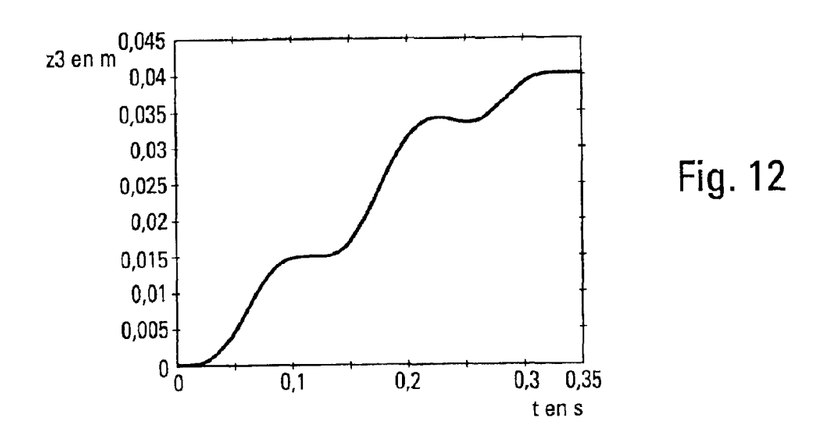
Figure 13:
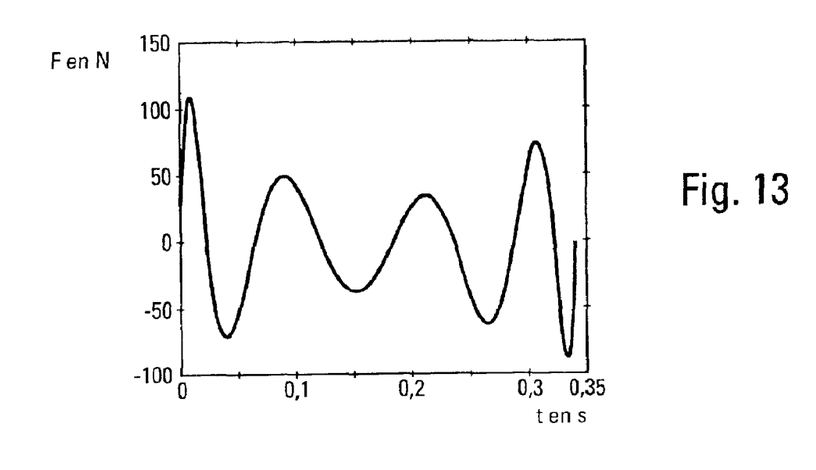

The device 1 in accordance with the invention and represented diagrammatically in FIGS. 1 and 2, according to two different embodiments, is intended for displacing a moveable unit 4, for example a moveable carriage, on a base 2, in particular a test bench.

This device 1 can for example be applied to fast XY tables used in microelectronics, to machine tools, to conveyors, to robots, etc.

In a known manner, said device 1 comprises, in addition to the base 2 and to the moveable unit 4:

supports 3, of known type, arranged between the base 2 and the floor S;

means (not represented), for example a rail, fixed on the base 2 and enabling the moveable unit 4 to be displaced linearly on said base 2; and a controllable actuator 5, preferably an electric motor, able to apply a force F to said moveable unit 4 with a view to its displacement on the base 2.

Within the context of the present invention, the device 1 comprises a system S1, S2 which is formed of various elements specified hereinbelow and variables according to the embodiment contemplated, which are brought into motion upon the displacement of the moveable unit 4.

According to the invention, said device 1 is improved in such a way as to obtain directly at the end of a displacement of the moveable unit 4:

accurate positioning of the latter in a reference frame (not represented), independent of the moveable unit 4 and of the base 2 and tied for example to the floor; and immobilization of all the moving elements of said system S1, S2.

To do this, the device 1 moreover comprises, according to the invention, calculation means 6 which calculate a particular force F, which is intended to be transmitted in the form of a control command to the actuator 5, as illustrated by a link 7, and which is such that, applied to said moveable unit 4, it produces a combined effect (and hence combined control):

on the one hand, on the moveable unit 4 so that it exactly carries out the envisaged displacement, especially as regards the prescribed duration and prescribed distance of displacement; and on the other hand, on said system S1, S2 so that all its moving elements are immobile at the end of the displacement of the moveable unit 4.

Accordingly, said calculation means 6 implement the process in accordance with the invention, according to which:

a) equations are defined which:
illustrate a dynamic model of said system (for example S1 or S2) formed by the different elements, of which said moveable unit 4 is one, which are brought into motion upon a displacement of said moveable unit 4; and
comprise at least three variables, of which the position of said moveable unit 4 is one;
b) all the variables of this system, together with said force F, are expressed as a function of one and the same intermediate variable y and of a specified number of derivatives as a function of time of this intermediate variable, said force F being required to be such that, applied to said moveable unit 4, it displaces the latter according to said specified displacement and renders all the elements of said system immobile at the end of said displacement;
c) the initial and final conditions of all said variables are determined;
d) the value as a function of time of said intermediate variable is determined from the expressions for the variables defined in step b) and said initial and final conditions; and
e) the value of said force is calculated from the expression for the force, defined in step b) and said value of the intermediate variable, determined in step d).

Thus, by virtue of the invention, the force F applied to the moveable unit 4 enables the latter to carry out the predetermined displacement envisaged, especially in terms of time and distance, whilst rendering the elements (specified hereinbelow) which are brought into motion by this displacement immobile at the end of the displacement so that they do not oscillate and, in particular, do not disturb the relative positioning between themselves and the moveable unit 4.

It will be noted moreover that, by reason of this combined effect or control of said moveable unit 4 and of said moving elements, one obtains an extremely accurate displacement of the moveable unit 4 in a reference frame independent of the base 2 and tied for example to the floor S.

Of course, the implementation of the present invention is not limited to a displacement along a single axis, but can also be applied to displacements along several axes which can be regarded as independent.

According to the invention, in step d), a polynomial expression for the intermediate variable y is used to determine the value of the latter, and the initial and final conditions of the different variables of the system, together with the expressions defined in step b) are used to determine the parameters of this polynomial expression.

The process in accordance with the invention will now be described in respect of four different systems (of moving elements).

In a first embodiment (not represented), the supports 3 are of elastic type and make it possible to isolate the base 2 from the vibrations originating from said floor S. The natural frequency of the base 2 on said elastic supports 3 is generally a few Hertz. Furthermore, in addition to the translational motion of the moveable unit 4 controlled by the force F, an angular motion is created between the base 2 and the moveable unit 4. Specifically, in this case, the axis of the moveable unit 4 does not pass through its center of mass, the force produced by the actuator 5 creates a moment about the vertical axis. The rail is assumed to be slightly flexible and thus allows the moveable unit 4 small rotational motions about the vertical axis, which corresponds to the aforesaid relative angular motion between the base 2 and the moveable unit 4.

Consequently, in this first embodiment, to displace the moveable unit 4 on the base 2 which is mounted elastically with respect to the floor and which may be subjected to a (relative) angular motion, the variables of the system are the linear position x of the moveable unit 4, the linear position xB of the base 2 and the angular position θz of the base 2, which satisfy the relations:

$$\begin{cases} x = y + \left(\frac{rB}{kB} + \frac{r\theta}{k\theta}\right)y^{(1)} + \left(\frac{mB}{kB} + \frac{rBr\theta}{kBk\theta} + \frac{J}{k\theta}\right)y^{(2)} + \\ \qquad \left(\frac{rBJ}{kBk\theta} + \frac{mBr\theta}{kBk\theta}\right)y^{(3)} + \frac{mBJ}{kBk\theta}y^{(4)} \\ xB = -\frac{m}{kB}\left(\frac{J}{k\theta}y^{(4)} + \frac{r\theta}{k\theta}y^{(3)} + y^{(2)}\right) \\ \theta z = -d\frac{m}{k\theta}\left(\frac{mB}{kB}y^{(4)} + \frac{rB}{kB}y^{(3)} + y^{(2)}\right) \end{cases}$$

in which
m is the mass of the moveable unit 4;
mB, kB, kθ, rB, rθ are respectively the mass, the linear stiffness, the torsional stiffness, the linear damping and the torsional damping of the base 2;
J is the inertia of the base 2 with respect to a vertical axis;
d is the distance between the axis of translation of the center of mass of the moveable unit 4 and that of the base 2; and
$y^{(1)}$, $y^{(2)}$, $y^{(3)}$ and $y^{(4)}$ are respectively the first to fourth derivatives of the variable y.

Specifically, in this first embodiment, the balance of the forces and of the moments, the angle θz being approximated to first order, may be written:

$$\begin{cases} mx^{(2)} = F \\ mBxB^{(2)} = -F - kBxB - rBxB^{(1)} \\ J\theta z^{(2)} = -dF - k\theta\theta z - r\theta\theta z^{(1)} \end{cases} \quad (1)$$

It will be noted that, within the context of the present invention, $\alpha^{(\beta)}$ is the derivative of order β with respect to time of the parameter α, regardless of α. Thus, for example, $x^{(1)}$ is the first derivative of x with respect to time.

The calculation of the intermediate variable y is achieved by putting $$s = \frac{d}{dt},$$

x=P(s)y, xB=PB(s)y, θz=Pθ(s)y and by rewriting the system (1) with this notation:

$$\begin{cases} ms^2 P(s)y = F \\ (mBs^2 + rBs + kB)PB(s)y = -F \\ (Js^2 + r\theta s + k\theta)P\theta(s)y = -dF \end{cases}$$

i.e.:

$$(mBs^2 + rBs + kB)PB(s) = \frac{1}{d}(Js^2 + r\theta s + k\theta)P\theta(s) = -ms^2 P(s)$$

and hence:

$$\begin{cases} P(s) = \left(\frac{mB}{kB}s^2 + \frac{rB}{kB}s + 1\right)\left(\frac{J}{k\theta}s^2 + \frac{r\theta}{k\theta}s + 1\right) \\ PB(s) = -\frac{m}{kB}s^2\left(\frac{J}{k\theta}s^2 + \frac{r\theta}{k\theta}s + 1\right) \\ P\theta(s) = -d\frac{m}{k\theta}s^2\left(\frac{mB}{kB}s^2 + \frac{rB}{kB}s + 1\right) \end{cases}$$

From these expressions, we immediately deduce:

$$x = \left(\frac{mB}{kB}s^2 + \frac{rB}{kB}s + 1\right)\left(\frac{J}{k\theta}s^2 + \frac{r\theta}{k\theta}s + 1\right)y \tag{2}$$

$$\begin{cases} x = y + \left(\frac{rB}{kB} + \frac{r\theta}{k\theta}\right)y^{(1)} + \left(\frac{mB}{kB} + \frac{rBr\theta}{kBk\theta} + \frac{J}{k\theta}\right)y^{(2)} + \left(\frac{rBJ}{kBk\theta} + \frac{mBr\theta}{kBk\theta}\right)y^{(3)} + \frac{mBJ}{kBk\theta}y^{(4)} \\ xB = -\frac{m}{kB}\left(\frac{J}{k\theta}y^{(4)} + \frac{r\theta}{k\theta}y^{(3)} + y^{(2)}\right) \\ \theta z = -d\frac{m}{k\theta}\left(\frac{mB}{kB}y^{(4)} + \frac{rB}{kB}y^{(3)} + y^{(2)}\right) \end{cases}$$

The expression for y as a function of x, $x^{(1)}$, xB, $xB^{(1)}$, $\theta z$ and $\theta z^{(1)}$ is obtained by inversion. However, this formula is not necessary in order to plan the trajectories of x, xB and $\theta z$. Specifically, since we want a stop-stop displacement of the moveable unit 4 between x0 at the instant t0 and x1 at the instant t1, with $x^{(1)}(t0)=0=x^{(1)}(t1)$ and $xB(t0)=0=xB(t1)$, $xB^{(1)}(t0)=0=XB^{(1)}(t1)$ and $\theta z(t0)=0=\theta z(t1)$, $\theta z^{(2)}(t0)=0=\theta z^{(1)}(1)$, with in addition $F(t0)=0=F(t1)$,
we deduce therefrom through the aforesaid expressions (2) that $y(t0)=x0, y(t1)=x1$ and $y^{(1)}(ti)=y^{(2)}(ti)=y^{(3)}(ti)=y^{(4)}(ti)=y^{(5)}(ti)=y^{(6)}(ti)=0$, i=0.1 i.e. 14 initial and final conditions.

It is sufficient to choose y as a polynomial with respect to time of the form:

$$y(t) = x0 + (x1 - x0)(\sigma(t))^{\alpha} \sum_{i=0}^{\beta} ai(\sigma(t))^i \tag{3}$$

with $$\sigma(t) = \frac{t - t0}{t1 - t0}$$

and $\alpha \geq 7$ and $\beta \geq 6$. The coefficients a0, ....., a$\beta$ are then obtained, according to standard methods, by solving a linear system.

The reference trajectory sought for the displacement of the moveable unit 4 is then given by expressions (2) with y(t) given by expression (3).

Moreover, the force F as a function of time to be applied to the means 5 is obtained by integrating the value of y obtained via expression (3) in the expression $F(t)=M.x^{(2)}(t)$.

In this first embodiment, we obtain:

$$F(t) = M\left[y^2 + \left(\frac{rB}{kB} + \frac{r\theta}{k\theta}\right)y^{(3)} + \left(\frac{mB}{kB} + \frac{rBr\theta}{kBk\theta} + \frac{J}{k\theta}\right)y^{(4)} + \left(\frac{rBJ + mBr\theta}{kBk\theta}\right)y^{(5)} + \frac{mBJ}{kBk\theta}y^{(6)}\right] \tag{3A}$$

with y(t) given by expression (3).

Thus, since by virtue of the device 1 the base 2 is immobilized at the end of the displacement, it does not disturb the positioning of the moveable unit 4 in the aforesaid reference frame so that said moveable unit 4 is positioned in a stable manner as soon as its displacement ends. Moreover, since its displacement is carried out in an accurate manner, its positioning corresponds exactly in said reference frame to the sought-after positioning.

Represented in FIGS. 3 to 7 are the values respectively of said variables y (in meters m), x (in meters m), xB (in meters m), $\theta z$ (in radians rd) and F (in Newtons N) as a function of time t (in seconds s) for a particular exemplary embodiment, for which:
m=40 kg;
m=800 kg;

kB=mB(5.2π)² corresponding to a natural frequency of 5 Hz;
rB=0.3√kBmB corresponding to a normalized damping of 0.3;
J=120 Nm corresponding to the inertia of the moveable unit 4;
kη=J(10.2π)² corresponding to a natural rotational frequency of 10 Hz;
r☐=0.3√θJ corresponding to a normalized rotational damping of 0.3;
d=0.01 m corresponding to the off-centering of the moveable unit 4;
t1−t0=0.4 s; and
x1=x0=25 mm.

The moveable unit 4 is displaced from the position x0 at rest ($x0^{(1)}=0$) at the instant to, to the position x1 at rest ($x1^{(1)}=0$) at the instant t1. It is therefore displaced over a distance of 25 mm in 0.4 s. To obtain this displacement, as well as the immobilization (at the end of said displacement) of the various motions to which the displacement gives rise, the force F represented in FIG. 7 should be applied to said moveable unit 4. This force is given by expression (3A) with y given by (3) for α=7 and β=6. In this case, the coefficients a0 up to a6 are given by a0=1716, a1=−9009, a2=20020, a3=−24024, a4=16380, a5=−6006, a6=924.

In a second embodiment represented in FIG. 1, the system S1 comprises, in addition to the moveable unit 4, a number p of auxiliary masses MAi, p being greater than or equal to 1, i going from 1 to p, which are linked respectively by elastic links e1 to ep of standard type, in particular springs, to said moveable unit 4. In the example represented, p=3.

In this case, the variables of the system are the position x of the moveable unit 4 and the positions zi of the p auxiliary masses MAi, which satisfy the relations:

$$\begin{cases} x = \left(\prod_{i=1}^{p}\left(\frac{mi}{ki}s^2 + \frac{ri}{ki}s + 1\right)\right) \cdot y \\ zi = \left(\prod_{\substack{j=1 \\ j \neq i}}^{p}\left(\frac{mj}{kj}s^2 + \frac{rj}{kj}s + 1\right)\right) \cdot \left(\frac{ri}{ki}s + 1\right) \cdot y \end{cases} \tag{4}$$

in which:

Π illustrates the product of the associated expressions;
mi zi, ki and ri are respectively the mass, the position, the stiffness and the damping of an auxiliary mass MAi;

mj, kj and rj are respectively the mass, the stiffness and the damping of an auxiliary mass MAj; and s=d/dt.

Specifically, the dynamic model of the system S1 may be written:

$$\begin{cases} Mx^{(2)} = F + \sum_{i=1}^{p}(ki(zi-x)+ri(zi^{(1)}-x^{(1)})) \\ Mizi^{(2)} = ki(x-zi)+ri(x^{(1)}-zi^{(1)}), i=1,\ldots p. \end{cases} \quad (5)$$

As in the foregoing, we wish to find laws of motion which ensure the desired displacement of the moveable unit 4, the auxiliary masses MAi (for example measurement devices and/or loads) being immobilized as soon as the moveable unit 4 stops.

Accordingly, the intermediate variable y is calculated by the same approach as earlier and the trajectory of the moveable unit 4 is planned by way thereof.

The intermediate variable y being required to satisfy x=P(s)y, zi=Pi(s)y, i=1, . . . . . , p, with $$s = \frac{d}{dt},$$

we must have, substituting these relations into the system (5):

$$(mis^2+ris+ki)Pi=(ris+ki)P, i=1,\ldots,p$$

From this expression, we immediately derive:

$$P(s) = \left(\prod_{i=1}^{p}\left(\frac{mi}{ki}s^2+\frac{ri}{ki}s+1\right)\right), Pi = \left(\prod_{\substack{j=1 \\ j\neq i}}^{p}\left(\frac{mj}{kj}s^2+\frac{rj}{kj}s+1\right)\right)\left(\frac{ri}{ki}s+1\right),$$

thereby proving the aforesaid formulae (4).
In this case, it may be demonstrated that the force F to be applied satisfies the relation:

$$F(t) = \left[\left(Ms^2+\left(\sum_{j=1}^{p}rj\right)s+\left(\sum_{j=1}^{p}kj\right)\right)\prod_{i=1}^{p}\left(\frac{mi}{ki}s^2+\frac{ri}{ki}s+1\right)-\right.$$

-continued $$\left.\sum_{i=1}^{p}(ris+ki)\prod_{\substack{j=1 \\ j\neq i}}^{p}\left(\frac{mj}{kj}s^2+\frac{rj}{kj}s+1\right)\right]y.$$

The aforesaid formulae are verified and specified hereinbelow for two and three auxiliary masses MAi respectively.
In the case of two auxiliary masses (p=2), the model may be written:

$$\begin{cases} Mx^{(2)} = F-k1(x-z1)-r1(x^{(1)}-z1^{(1)})-k2(x-z2)-r2(x^{(1)}-z2^{(1)}) \\ m1z1^{(2)} = k1(x-z1)+r1(x^{(1)}-z1^{(1)}) \\ m2z2^{(2)} = k2(x-z2)+r2(x^{(1)}-z2^{(1)}) \end{cases}$$

From this we immediately deduce:

$$\begin{cases} x = \left(\frac{m1}{k1}s^2+\frac{r1}{k1}s+1\right)\left(\frac{m2}{k2}s^2+\frac{r2}{k2}s+1\right)y \\ z1 = \left(\frac{r1}{k1}s+1\right)\left(\frac{m2}{k2}s^2+\frac{r2}{k2}s+1\right)y \\ z2 = \left(\frac{r2}{k2}s+1\right)\left(\frac{m1}{k1}s^2+\frac{r1}{k1}s+1\right)y \end{cases} \quad (6)$$

i.e, putting $$\frac{mi}{ki} = Ti^2$$

and $$\frac{ri}{ki} = 2DiTi,$$

i=1.2;

$$\begin{cases} x = y + 2(D1T1+D2T2)y^{(1)}+(T1^2+T2^2+4D1D2T1T2)y^{(2)} + \\ \quad 2(D1T1T2^2+D2T2T1^2)y^{(3)}+(T1^2T2^2)y^{(4)} \\ z1 = y+2(D1T1+D2T2)y^{(1)}+(T2^2+4D1D2T1T2)y^{(2)}+(2D1T1T2^2)y^{(3)} \\ z2 = y+2(D1T1+D2T2)y^{(1)}+(T1^2+4D1D2T1T2)y^{(2)}+(2D2T2T1^2)y^{(3)}. \end{cases}$$

The expression for y, or more precisely the expressions for y, $y^{(1)}$, $y^{(2)}$, $y^{(3)}$, $y^{(4)}$ and $y^{(5)}$, are deduced therefrom by inverting the system obtained on the basis of x, z1, z2, $x^{(1)}$, $z1^{(1)}$, $z2^{(1)}$.

We deduce therefrom that, to perform a displacement from x0 at the instant t0 to x1 at the instant t1, with the auxiliary masses at rest at t0 and t1, it is sufficient to construct a reference trajectory for y with the initial and final conditions y(t0)=x0, y(t1)=x1 and all the derivatives $y^{(k)}$ (t0)=$y^{(k)}$(t1)=0, k varying from 1 to 6 or more if necessary, and to deduce therefrom the reference trajectories of the main and auxiliary masses, as well as of the force F to be applied to the motor.

In this case, the force F satisfies the relation:

$$F(t) = \left[(Ms^2 + (r1+r2)s + (k1+k2))\left(\frac{m1}{k1}s^2 + \frac{r1}{k1}s + 1\right)\left(\frac{m2}{k2}s^2 + \frac{r2}{k2}s + 1\right) - (r1s+k1)\left(\frac{m2}{k2}s^2 + \frac{r2}{k2}s + 1\right) - (r2s+k2)\left(\frac{m1}{k1}s^2 + \frac{r1}{k1}s + 1\right)\right]y.$$

Furthermore, the model for three auxiliary masses MAi (p=3) [see FIG. 1], may be written, as earlier:

$$\begin{cases} Mx^{(2)} = F - k1(x-z1) - r1(x^{(1)} - z1^{(1)}) - \\ \quad k2(x-z2) - r2(x^{(1)} - z2^{(1)}) - k3(x-z3) - \\ \quad r3(x^{(1)} - z3^{(1)}) \\ m1z1^{(2)} = k1(x-z1) + r1(x^{(1)} - z1^{(1)}) \\ m2z2^{(2)} = k2(x-z2) + r2(x^{(1)} - z2^{(1)}) \\ m3z3^{(2)} = k3(x-z3) + r3(x^{(1)} - z3^{(1)}) \end{cases}$$

From this we immediately deduce:

$$\begin{cases} x = \left(\frac{m1}{k1}s^2 + \frac{r1}{k1}s + 1\right)\left(\frac{m2}{k2}s^2 + \frac{r2}{k2}s + 1\right)\left(\frac{m3}{k3}s^2 + \frac{r3}{k3}s + 1\right)y \\ z1 = \left(\frac{r1}{k1}s + 1\right)\left(\frac{m2}{k2}s^2 + \frac{r2}{k2}s + 1\right)\left(\frac{m3}{k3}s^2 + \frac{r3}{k3}s + 1\right)y \\ z2 = \left(\frac{r2}{k2}s + 1\right)\left(\frac{m1}{k1}s^2 + \frac{r1}{k1}s + 1\right)\left(\frac{m3}{k3}s^2 + \frac{r3}{k3}s + 1\right)y \\ z3 = \left(\frac{r3}{k3}s + 1\right)\left(\frac{m1}{k1}s^2 + \frac{r1}{k1}s + 1\right)\left(\frac{m2}{k2}s^2 + \frac{r2}{k2}s + 1\right)y \end{cases} \quad (7)$$

We proceed as earlier in order to determine the values as a function of time of the different variables and in particular of the force F, the latter satisfying the expression:

$$F(t) = [(Ms^2 + (r1+r2+r3)s + (k1+k2+k3)) \cdot \\ \left(\frac{m1}{k1}s^2 + \frac{r1}{k1}s + 1\right)\left(\frac{m2}{k2}s^2 + \frac{r2}{k2}s + 1\right)\left(\frac{m3}{k3}s^2 + \frac{r3}{k3}s + 1\right) - \\ (r1s+k1)\left(\frac{m2}{k2}s^2 + \frac{r2}{k2}s + 1\right)\left(\frac{m3}{k3}s^2 + \frac{r3}{k3}s + 1\right) - \\ (r2s+k2)\left(\frac{m1}{k1}s^2 + \frac{r1}{k1}s + 1\right)\left(\frac{m3}{k3}s^2 + \frac{r3}{k3}s + 1\right) - \\ (r3s+k3)\left(\frac{m1}{k1}s^2 + \frac{r1}{k1}s + 1\right)\left(\frac{m2}{k2}s^2 + \frac{r2}{k2}s + 1\right)]y.$$

Represented in FIGS. 8 to 13 are the values respectively of the variables y, x, z1, z2, z3 and F as a function of time t for a particular example of the embodiment of FIG. 1, z1 to z3 being the displacements of the auxiliary masses MA1, MA2 and MA3 respectively. The variables y, x, z1, z2 and z3 are expressed in meters (m) and the force F in Newtons (N).

This example is such that:
M=5 kg;
m1=0.1 kg;
m2=0.01 kg;
m3=0.5 kg;
k1=m1$(5.2\pi)^2$, k2=m2$(4.2\pi)^2$, k3=m3$(6.2\pi)^2$, corresponding to natural frequencies of 5, 4 and 6 Hz respectively;
r1=0.3$\sqrt{k1m1}$, r2=0.2$\sqrt{k2m2}$, r3=0.15$\sqrt{k3m3}$, corresponding to normalized dampings of 0.3, 0.2 and 0.15 respectively;
t1−t0=0.34 s; and
x1−x0=40 mm.

Additionally, in a third embodiment represented in FIG. 2, the system S2 comprises the moveable unit 4, the base 2 which is mounted elastically with respect to the floor S and an auxiliary mass MA which is linked by way of an elastic link eA of standard type to said base 2.

In this case, the variables of the system are the positions x, xB and zA of the moveable unit 4, of the base B and of the auxiliary mass MA, which satisfy the relations:

$$\begin{cases} x = [(mAs^2 + rAs + kA) \cdot (mBs^2 + (rA+rB)s + (kA+kB)) - (rAs+kA)^2] \cdot y \\ xB = -My^{(2)} \\ zA = -M(rAy^{(3)} + kAy^{(2)}) \end{cases} \quad (8)$$

in which:
M, mB and mA are the masses respectively of the moveable unit 4, of the base 2 and of the auxiliary mass MA;
rA and rB are the dampings respectively of the auxiliary mass MA and of the base 2;
kA and kB are the stiffnesses respectively of the auxiliary mass MA and of the base 2; and
s=d/dt.

Specifically, the dynamic model of the system S2 may be written:

$$\begin{cases} Mx^{(2)} = F \\ mBxB^{(2)} = -F - kBxB - rBxB^{(1)} - k(xB-zA) - rA(xB^{(1)} - zA^{(1)}) \\ mzA^{(2)} = kA(xB-zA) + rA(xB^{(1)} - zA^{(1)}) \end{cases} \quad (9)$$

The intermediate variable must satisfy: x=P(s)Y, xB=PB(s)y and zA=Pz(s)y with s $$s = \frac{d}{dt}.$$

Substituting these expressions into (9), we obtain:

$$\begin{cases} F = Ms^2 P(s)y \\ (mBs^2 + (rA+rB)s + (kA+kB))PB(s) = -Ms^2 P(s) + (rAs+kA)Pz(s) \\ (mAs^2 + rAs + kA)Pz(s) = (rAs+kA)PB(s). \end{cases}$$

On eliminating Pz from the last equation, it follows that:

$[(mAs^2+rAs+kA)(mBs^2+(rA+rB)s+(kA+kB))-(rAs+kA)^2]PB=-(mAs^2+rAs+kA)M^2P$ from which we derive:

$$\begin{cases} P = (mAs^2 + rAs + kA)(mBs^2 + (rA + rB)s + (kA + kB)) - (rAs + kA)^2 \\ PB = -Ms^2 \\ Pz = -Ms^2(rAs + kA) \end{cases}$$

thus making it possible to obtain the aforesaid expressions (8).

The values as a function of time of the different variables, and in particular the force F, are then obtained as before.

In this case, said force F satisfies the expression:

$$F(t) = M[(mAs^2 + rAs + kA)(mBs^2 + (rA+rB)s + (KA+kB)) - (rAs+kA)^2] y^{(2)}.$$

In a fourth and last embodiment (not represented), the system is formed of the moveable unit 4, of the base 2 and of an auxiliary mass MC which is tied elastically to said moveable unit 4.

In this case, the variables of the system are the positions x, xB and zC respectively of the moveable unit 4, of the base 2 and of the auxiliary mass MC, which satisfy the relations:

$$\begin{cases} x = [(mCs^2 + rCs + kC) \cdot (mBs^2 + rBs + kB] \cdot y \\ xB = [(mCs^2 + rCs + kC) \cdot (Ms^2 + rCs + kC) - (rCs + kC)^2] \cdot y \\ zC = (rCs + kC)(mBs^2 + rBs + kB) \cdot y \end{cases}$$

in which:

M, mB and mC are the masses respectively of the moveable unit 4, of the base 2 and of the auxiliary mass MC;

rB and rC are the dampings respectively of the base 2 and of the auxiliary mass MC;

kB and kC are the stiffnesses respectively of the base 2 and of the auxiliary mass MC; and s=d/dt.

Specifically, the dynamic model of this system may be written:

$$\begin{cases} Mx^{(2)} = F - kC(x - zC) - rC(x^{(1)} - zC^{(1)}) \\ mBxB^{(2)} = -F - kBxB - rBxB^{(1)} \\ mCzC^{(2)} = kC(x - zC) + rC(x^{(1)} - zC^{(1)}) \end{cases} \quad (10)$$

By using, as in the foregoing, the polynomial representation of the variable $$s = \frac{d}{dt},$$

the system (10) becomes:

$$\begin{cases} (Ms^2 + rCs + kC)x = F + (rCs + kC)zC \\ (mBs^2 + rBs + kB)xB = -F \\ (mCs^2 + rCs + kC)zC = (rCs + kC)x \end{cases},$$

which, together with the expressions for each of the variables as a function of the intermediate variable (and of its derivatives), x=P(s)y,xB=PB(s)y,zC=Pz(s)y, finally gives:

$$\begin{cases} P = (mCs^2 + rCs + kC)(mBs^2 + rBs + kB) \\ PB = (mCs^2 + rCs + kC)(Ms^2 + rCs + kC) - (rCs + kC)^2 \\ Pz = (rCs + kC)(mBs^2 + rBs + kB) \end{cases}$$

The construction of the reference trajectories of y, and then of x, xB, zC and F is done as indicated earlier.

In this case, the force F satisfies:

$$F(t) = -(mBs^2 + rBs + kB)[ (mCs^2 + rCs + kC)(Ms^2 + rCs + kC) - (rCs + kC)^2] y.$$

A method in accordance with the invention will now be described which makes it possible to determine in a general and fast manner the expressions defined in the aforesaid step b) of the process in accordance with the invention, for linear systems of the form:

$$\sum_{j=1}^{p} A_{i,j}(s) x_j = b_i F, i = 1, \ldots, p \quad (11)$$

where the $A_{i,j}(s)$ are polynomials of the variable s, which, in the case of coupled mechanical systems, are of degree less than or equal to 2 and where one at least of the coefficients bi is non-zero. F is the control input which, in the above examples, is the force produced by the actuator 5.

Accordingly, according to the invention, in step b), the following operations are carried out:

the different variables xi of said system (for example S1 or S2), i going from 1 to p, p being an integer greater than or equal to 2, each being required to satisfy a first expression of the form:

$$xi = \sum_{j=0}^{j=r} p_{i,j} \cdot y^{(j)},$$

the $y^{(j)}$ being the derivatives of order j of the intermediate variable y, r being a predetermined integer and the pi,j being parameters to be determined, a second expression is obtained by putting $y^{(j)} = s^j \cdot y$:

$$xi = \left( \sum_{j=0}^{j=r} p_{i,j} \cdot s^j \right) y = Pi(s) \cdot y$$

a third expression of vectorial type is defined on the basis of the second expressions relating to the different variables xi of the system:

X=P.y $$\begin{cases} P = \begin{pmatrix} P1 \\ \vdots \\ P_p \end{pmatrix} \\ X = \begin{pmatrix} x1 \\ \vdots \\ xp \end{pmatrix} \end{cases}$$

said vector P is calculated, replacing X by the value P.y in the following expressions:

$$\begin{cases} B^T \cdot A(s) \cdot P(s) = Op-1 \\ bp \cdot F = \left( \sum_{j=1}^{j=p} Ap, j(s) \cdot Pj(s) \cdot Y \right) \end{cases}$$

in which:

$B^T$ is the transpose of a matrix B of size px(p−1) and of rank p−1, such that $B^T b = Op-1$;

bp is the p-th component of the vector b; and

Op−1 is a zero vector of dimension (p−1);

the values of the different parameters pi,j are deduced from the value thus calculated of the vector P; and from these latter values are deduced the values of the variables xi as a function of the intermediate variable y and of its derivatives, on each occasion using the corresponding first expression.

The aforesaid method is now justified.

Let us denote by A(s) the matrix of size pxp whose coefficients are the polynomials Ai,j(s), i,j=1, . . . , p, i.e.:

$$A(s) = \begin{pmatrix} A1,1(s) & \cdots & A1,p(s) \\ \vdots & & \vdots \\ Ap,1(s) & \cdots & Ap,p(s) \end{pmatrix}, X = \begin{pmatrix} x1 \\ \vdots \\ xp \end{pmatrix} \text{ and } b = \begin{pmatrix} b1 \\ \vdots \\ bp \end{pmatrix}$$

Without loss of generality, it can be assumed that the rank of A(s) is equal to p (otherwise, the system is written together with its redundant equations and it is sufficient to eliminate the dependent equations) and that bp≠0. There then exists a matrix B of size px(p−1) and of rank p−1 such that: $B^T b = 0 p-1$ where T represents transposition and Op−1 the vector of dimension p−1, all of whose components are zero. The system (11) premultiplied by $B^T$ then becomes:

$$B^T A(s) X = Op-1, bpF = \sum_{j=1}^{p} Ap, j \times j. \qquad (12)$$

As indicated earlier, an intermediate variable y is characterized in that all the components of the vector X can be expressed as a function of y and of a finite number of its derivatives. For a controllable linear system, such an output always exists and the components of X can be found in the form of linear combinations of y and of its derivatives, i.e.:

$$xi = \sum_{j=0}^{r} pi, jy^{(j)}$$

where $y^{(j)}$ is the derivative of order j of y with respect to time and where the pi,j are real numbers which are not all zero, or alternatively:

$$xi = \left( \sum_{j=0}^{r} pi, js^j \right) y = Pi(s)y, i = 1, \ldots, p.$$

We shall calculate the vector $$P(s) = \begin{pmatrix} P1(s) \\ \vdots \\ Pp(s) \end{pmatrix},$$

by replacing X by its value P(s)y in (12):

$$B^T A(s) P(s) = Op-1, bpF = \sum_{j=1}^{p} Ap, j(s) Pj(s) y. \qquad (13)$$

Consequently, P belongs to the kernel of the matrix $B^T A(s)$ of dimension 1, since B is of rank p−1 and A(s) of rank p. To calculate P, let us denote by A1(s), . . . , Ap(s) the columns of the matrix A(s) and Â(s) the matrix of size (p−1)x(p−1) defined by:

Â(s)=(A2(s), . . . , Ap(s)).

Let us also denote by $\hat{P}(s)$ the vector of dimension p−1 defined by:

$$\hat{P}(s) = \begin{pmatrix} P2(s) \\ \vdots \\ Pp(s) \end{pmatrix}.$$

Let us rewrite (13) in the form $B^T A1(s) P1(s) + B^T Â(s) \hat{P}(s) = 0p-1$ or alternatively $B^T Â(s) \hat{P}(s) = -B^T A1(s) P1(s)$. Since the matrix $B^T Â(s)$ is invertible, we have:

$\hat{P}(s) = -(B^T Â(s))^{-1} B^T A1(s) P1(s)$ i.e.:

$$\hat{P}(s) = -\frac{1}{det(B^T Â(s))} \left( co(B^T Â(s)) \right)^T B^T A1(s) P1(s) \qquad (14)$$

where $co(B^T Â(s))$ is the matrix of the cofactors of $B^T Â(s)$.

From this we immediately deduce that it is sufficient to choose:

$$\begin{cases} P1(s) = det(B^T Â(s)) \\ \hat{P}(s) = -\left( co(B^T Â(s)) \right)^T B^T A1(s) \end{cases} \qquad (15)$$

this completing the calculation of the vector P(s).

It will be observed that if the Ai,j(s) are polynomials of degree less than or equal to m, the degree of each of the components of P is less than or equal to mp. Specifically, in this case, the degree of the determinant det $(B^T Â(s))$ is less than or equal to (p−1)m and the degree of each of the rows of $(co (B^T Â(s)))^T B^T$ A1(s), using the fact that the degree of a product of polynomials is less than or equal to the sum of the degrees, is less than or equal to (p−1)m+m=pm, hence the aforesaid result.

In all the examples presented earlier, which model mechanical subsystems, we have m=2.

It may easily be verified that this general method yields the same calculations for P as in each of the examples already presented hereinabove.

We shall return to certain of the examples dealt with earlier and show how the calculation of the variable y makes it possible to achieve passive isolation of the elastic modes.

In all these examples, the trajectories are generated on the basis of polynomial trajectories of the intermediate value y, which are obtained through interpolation of the initial and final conditions. Furthermore, we are interested only in the particular case where the system is at rest at the initial and final instants, thereby making it possible to establish simple and standard formulae which depend only on the degree of the polynomial.

In the simplest case, where the initial and final derivatives of y are zero up to order 4, the sought-after polynomial is of degree 9:

$$\begin{cases} y(t0) = y0 & y^{(1)}(t0) = 0 & y^{(2)}(t0) = 0 & y^{(3)}(t0) = 0 & y^{(4)}(t0) = 0 \\ y(t1) = y1 & y^{(1)}(t1) = 0 & y^{(2)}(t1) = 0 & y^{(3)}(t1) = 0 & y^{(4)}(t1) = 0 \end{cases}$$

which gives:

$$y(t) = y0 + (y1-y0)\sigma^5(126 - 420\sigma + 540\sigma^2 - 315\sigma^3 + 70\sigma^4),$$

$$\sigma = \left(\frac{t - t0}{t1 - t0}\right) \tag{16}$$

If we ask for a polynomial such that the initial and final derivatives are zero up to order 5, the sought-after polynomial is of degree 11:

$$y(t) = y0 + (y1-y0)\sigma^6(462 - 1980\sigma + 3465\sigma^2 - 3080\sigma^3 + 1386\sigma^4 - 252\sigma^5)$$

still with σ defined as in (16).

If we ask for a polynomial such that the initial and final derivatives are zero up to order 6, the sought-after polynomial is of degree 13:

$$y(t) = y0 + (y1-y0)\sigma^7(1716 - 9009\sigma + 20020\sigma^2 - 24024\sigma^3 + 16380\sigma^4 - 6006\sigma^5 + 924\sigma^6).$$

What is claimed is:

1. A process for displacing a moveable unit (4) on a base (2), said moveable unit (4) being displaced linearly according to a predetermined displacement under the action of a controllable force (f), wherein:
   a) equations are defined which: illustrate a dynamic model of a system formed by elements (2, 4, MA, MA1, MA2, MA3), of which said moveable unit (4) is one, which are brought into motion upon a displacement of said moveable unit (4); and
   comprise at least two variables, of which the position of said moveable unit (4) is one;
   b) all the variables of this system, together with said force (F), are expressed as a function of one and the same intermediate variable y and of a specified number of derivatives as a function of time of this intermediate variable, said force (F) being such that, applied to said moveable unit (4), it displaces the latter according to said specified displacement and renders all the elements of said system immobile at the end of said displacement;
   c) the initial and final conditions of all said variables are determined;
   d) the value as a function of time of said intermediate variable is determined from the expressions for the variables defined in step b) and said initial and final conditions;
   e) the value as a function of time of said force is calculated from the expression for the force, defined in step b) and said value of the intermediate variable, determined in step d); and
   f) the value thus calculated of said force (F) is applied to said moveable unit (4).

2. The process as claimed in claim 1, wherein, in step a), the following operations are carried out: the variables of the system are denoted xi, i going from 1 to p, p being an integer greater than or equal to 2, and the balance of the forces and of the moments is expressed, approximating to first order if necessary, in the so-called polynomial matrix form:

$$A(s)X = bF$$

with:

A(s) matrix of size p×p whose elements Aij(s) are polynomials of the variable s=d/dt;

$$\begin{pmatrix} x1 \\ \vdots \\ xp \end{pmatrix};$$

b the vector of dimension p; and

F the force exerted by a means of displacing the moveable unit and in that, in step b), the following operations are carried out:

the different variables xi of said system, i going from 1 to p, each being required to satisfy a first expression of the form:

$$xi = \sum_{j=0}^{j=r} pi, j \cdot y^{(j)},$$

the $y^{(j)}$ being the derivatives of order j of the intermediate variable y, r being a predetermined integer and the pij being parameters to be determined, a second expression is obtained by putting $y^{(j)} = s^j \cdot y$:

$$xi = \left(\sum_{j=0}^{j=r} pi, j \cdot s^j\right) y = Pi(s) \cdot y,$$

a third expression of vectorial type is defined on the basis of the second expressions relating to the different variables xi of the system (S1, S2):

$$X = P \cdot y$$

comprising the vector $$P = \begin{pmatrix} P1 \\ \vdots \\ Pp \end{pmatrix}$$

said vector P is calculated, by replacing X by the value P·y in the following system:

$$\begin{cases} B^T \cdot A(s) \cdot P(s) = Op - 1 \\ bp \cdot F = \sum_{j=1}^{j=p} Ap, j(s) \cdot Pj(s) \cdot y \end{cases}$$

in which:

$B^T$ is the transpose of a matrix B of size p×(p−1), such that $B^T b = Op-1$;

bp is the p-th component of the vector b previously defined; and

Op–1 is a zero vector of dimension (p–1);

the values of the different parameters pi,j are deduced from the value thus calculated of the vector P; and from these latter values are deduced the values of the variables xi as a function of the intermediate variable y and of its derivatives, on each occasion using the corresponding first expression.

3. The process as claimed in claim 1, wherein, in step d), a polynomial expression for the intermediate variable y is used to determine the value of the latter.

4. The process as claimed in claim 3, wherein, the initial and final conditions of the different variables of the system, together with the expressions defined in step b), are used to determine the parameters of the polynomial expression for the intermediate variable y.

5. The process as claimed in claim 1 for displacing a moveable unit (4) on a base (2) which is mounted elastically with respect to a floor (S) and which may be subjected to linear and angular motions, wherein the variables of the system are the linear position x of the moveable unit, the linear position xB of the base and the angular position θz of the base, which satisfy the relations:

$$\begin{cases} x = y + \left(\frac{rB}{kB} + \frac{r\theta}{k\theta}\right)y^{(1)} + \left(\frac{mB}{kB} + \frac{rBr\theta}{kBk\theta} + \frac{J}{k\theta}\right)y^{(2)} + \\ \quad \left(\frac{rBJ}{kBk\theta} + \frac{mBr\theta}{kBk\theta}\right)y^{(3)} + \frac{mBJ}{kBk\theta}y^{(4)} \\ xB = -\frac{m}{kB}\left(\frac{J}{k\theta}y^{(4)} + \frac{r\theta}{k\theta}y^{(3)} + y^{(2)}\right) \\ \theta z = -d\frac{m}{k\theta}\left(\frac{mB}{kB}y^{(4)} + \frac{rB}{kB}y^{(3)} + y^{(2)}\right) \end{cases}$$

which:

m is the mass of the moveable unit;

mB, kB, kθ, rB, rθ are respectively the mass, the linear stiffness, the torsional stiffness, the linear damping and the torsional damping of the base;

J is the inertia of the base with respect to a vertical axis;

d is the distance between the axis of translation of the center of mass of the moveable unit and that of the base; and $y^{(1)}$, $y^{(2)}$, $y^{(3)}$ and $y^{(4)}$ are respectively the first to fourth derivatives of the variable y.

6. The process as claimed in claim 1 for displacing on a base a moveable unit (4) on which are elastically mounted a number p of auxiliary masses MAi, p being greater than or equal to 1, i going from 1 to p, wherein the variables of the system are the position x of the moveable unit (4) and the positions zi of the p auxiliary masses MAi, which satisfy the relations:

$$\begin{cases} x = \left(\prod_{i=1}^{p}\left(\frac{mi}{ki}s^2 + \frac{ri}{ki}s + 1\right)\right) \cdot y \\ zi = \left(\prod_{\substack{j=1 \\ j \neq i}}^{p}\left(\frac{mj}{kj}s^2 + \frac{rj}{kj}s + 1\right)\right) \cdot \left(\frac{ri}{ki}s + 1\right) \cdot y \end{cases}$$

in which:

illustrates the product of the associated expressions;

mi, zi, ki and ri are respectively the mass, the position, the stiffness and the damping of an auxiliary mass MAi;

mj, kj and rj are respectively the mass, the stiffness and the damping of an auxiliary mass MAj; and s=d/dt.

7. The process as claimed in claim 1 for displacing a moveable unit (4) on a base (2) which is mounted elastically with respect to the floor (S) and on which is elastically mounted an auxiliary mass (MA), wherein the variables of the system are the positions x, xB and zA respectively of the moveable unit (4), of the base (2) and of the auxiliary mass (MA), which satisfy the relations:

$$\begin{cases} x = [(mAs^2 + rAs + kA) \cdot (mBs^2 + (rA + rB)s + (kA + kB)) - \\ \quad (rAs + kA)^2] \cdot y \\ xB = -My^{(2)} \\ zA = -M(rAy^{(3)} + kAy^{(2)}) \end{cases}$$

in which:

M, mB and mA are the masses respectively of the moveable unit (4), of the base (2) and of the auxiliary mass (MA);

rA and rB are the dampings respectively of the auxiliary mass (MA) and of the base (2);

kA and kB are the stiffnesses respectively of the auxiliary mass (MA) and of the base (2); and s=d/dt.

8. The process as claimed in claim 1 for displacing on a base mounted elastically with respect to a floor, a moveable unit on which is elastically mounted an auxiliary mass, wherein the variables of the system are the positions x, xB and zC respectively of the moveable unit, of the base and of the auxiliary mass, which satisfy the relations:

$$\begin{cases} x = [(mCs^2 + rCs + kC) \cdot (mBs^2 + rBs + kB] \cdot y \\ xB = [(mCs^2 + rCs + kC) \cdot (Ms^2 + rCs + kC) - (rCs + kC)^2] \cdot y \\ zC = (rCs + kC) \cdot (mBs^2 + rBs + kB) \cdot y \end{cases}$$

in which:

M, mB and mC are the masses respectively of the moveable unit, of the base and of the auxiliary mass;

rB and rC are the dampings respectively of the base and of the auxiliary mass;

kB and kC are the stiffnesses respectively of the base and of the auxiliary mass; and s=d/dt.

9. A device comprising:

a base (2);

a moveable unit (4) which may be displaced linearly on said base (2); and a controllable actuator (5) able to apply a force (F) to said moveable unit (4) with a view to its displacement on said base (2), wherein it furthermore comprises means (6) which implement steps a) to e) of the process specified under claim 1, so as to calculate a force (F) which may be applied to said moveable unit (4), and which determine a control command and transmit it to said actuator (5) so that it applies the force (F) thus calculated to said moveable unit (4).

10. A device, comprising:

a base;

a first body coupled to said base;

a second body coupled to said first body;

an actuator coupled to said first body; and, a computer that provides a control command to said actuator, said control command induces a force profile that causes said first body to move from a start position at a start time to an end position at an end time, so that said base has a zero displacement at the end time.

11. The device of claim 10, wherein the force profile is dependent upon an intermediate variable and derivatives of the intermediate variable.

12. The device of claim 10, wherein said second body has a zero displacement at the end time.

13. The device of claim 10 further comprising elastic mounts coupled to said base.

14. A device, comprising:

a base;

a first body coupled to said base;

a second body coupled to said first body;

an actuator coupled to said first body; and, calculation means for generating a control command to said actuator, said control command induces a force profile that causes said first body to move from a start position at a start time to an end position at an end time, so that said base has a zero displacement at the end time.

15. The device of claim 14, wherein the force profile is dependent upon an intermediate variable and derivatives of the intermediate variable.

16. The device of claim 14, wherein said second body has a zero displacement at the end time.

17. The device of claim 14, further comprising elastic mounts coupled to said base.

18. A device, comprising:

a base;

a first body coupled to said base;

a second body coupled to said base;

an actuator coupled to said first body; and, a computer that provides a control command to said actuator, said control command induces a force profile that causes said first body to move from a start position at a start time to an end position at an end time, so that said base has a zero displacement at the end time.

19. The device of claim 18, wherein the force profile is dependent upon an intermediate variable and derivatives of the intermediate variable.

20. The device of claim 18, wherein said second body has a zero displacement at the end time.

21. The device of claim 18, further comprising elastic mounts coupled to said base.

22. A device, comprising:

a base;

a first body coupled to said base;

a second body coupled to said base;

an actuator coupled to said first body; and, calculation means for generating a control command to said actuator, said control command induces a force profile that causes said first body to move from a start position at a start time to an end position at an end time, so that said base has a zero displacement at the end time.

23. The device of claim 22, wherein the force profile is dependent upon an intermediate variable and derivatives of the intermediate variable.

24. The device of claim 22, wherein said second body has a zero displacement at the end time.

25. The device of claim 22, further comprising elastic mounts coupled to said base.

26. A method for moving a first body relative to a base, wherein a second body is coupled to the first body, comprising:

calculating a control command to move the first body relative to the base; and exerting a force onto the first body, the force having a force profile that causes the first body to move from a start position at a start time to an end position at an end time, so that the base has a zero displacement a the end time.

27. The device of claim 26, wherein the force profile is dependent upon an intermediate variable and derivatives of the intermediate variable.

28. The device of claim 26, wherein said second body has a zero displacement at the end time.

29. A method for moving a first body relative to a base, wherein a second body is coupled to the base, comprising:

calculating a control command to move the first body relative to the base; and, exerting a force onto the first body, the force having a force profile that causes the first body to move from a start position at a start time to an end position at an end time, so that the base has a zero displacement at the end time.

30. The device of claim 29, wherein the force profile is dependent upon an intermediate variable and derivatives of the intermediate variable.

31. The device of claim 29, wherein said second body has a zero displacement at the end time.

* * * * *